United States Patent [19]

Harigaya et al.

[11] 3,942,241

[45] Mar. 9, 1976

[54] SEMICONDUCTOR DEVICES AND METHODS OF MANUFACTURING SAME

[75] Inventors: Hiroshi Harigaya; Toshio Kano; Eishi Aizawa, all of Suwa, Japan

[73] Assignee: Kabushiki Kaisha Suwa Seikosha, Tokyo, Japan

[22] Filed: Feb. 18, 1975

[21] Appl. No.: 550,396

Related U.S. Application Data

[62] Division of Ser. No. 309,857, Nov. 27, 1972, abandoned.

[30] Foreign Application Priority Data

Nov. 25, 1971 Japan.............................. 46-94703

[52] U.S. Cl. ..................... 29/571; 29/578; 29/590; 357/23
[51] Int. Cl.² ......................................... B01J 17/00
[58] Field of Search..................... 29/571, 578, 590

[56] References Cited
UNITED STATES PATENTS

| | | | |
|---|---|---|---|
| 3,475,234 | 10/1969 | Kerwin | 29/571 |
| 3,566,518 | 3/1971 | Brown | 29/571 |
| 3,699,646 | 10/1972 | Vadacz | 29/571 |
| 3,750,268 | 8/1973 | Wang | 29/571 |

*Primary Examiner*—W. Tupman
*Attorney, Agent, or Firm*—Blum, Moscovitz, Friedman & Kaplan

[57] ABSTRACT

A gate self-alignment type field-effect semiconductor device is formed with an insulating film deposited on the surface of a substrate. A polycrystal silicon doped with impurities having a type of conductivity opposite to the conductivity of the substrate extends through a gap in said insulating film to engage the surface of said substrate so as to serve as both a diffusion source and electrode for each of the source and drain of the device.

18 Claims, 11 Drawing Figures ically, to insulated gate type field-effect transistors, and to the formation of integrated circuits consisting of such transistors.
SEMICONDUCTOR DEVICES AND METHODS OF MANUFACTURING SAME This is a division of application Ser. No. 309,857 filed Nov. 27, 1972, now abandoned.

BACKGROUND OF THE INVENTION

This invention relates to semiconductor devices, and in particular, to insulated gate type field-effect transistors, and to the formation of integrated circuits consisting of such transistors.

Conventional insulated gate field-effect transistors cannot provide the high-speed operation and low power dissipation desired. This results from the limited frequency dependence of the known devices caused by the superposed feedback capacitance between the gate electrode and each of the source and drain. Further, the width of the source and drain in the conventional insulated gate type field-effect transistors is limited by the accuracy of photo-etching and is such as to make difficult integration of a large number of such transistors. Further, the width and length of the source and drain greatly increases the junction capacitance of the device, preventing high speed operation and low power dissipation. By using a polycrystal silicon doped with impurities as a diffusion source and as an electrical conductor, the foregoing difficiencies have been avoided.

SUMMARY OF THE INVENTION

Generally speaking, in accordance with the invention, an insulated gate type field-effect semiconductor device is provided having an insulating film on the surface of a silicon substrate, two regions of a polycrystal silicon doped with impurities having a type of conductivity opposite to that of the substrate being deposited on said insulating film, each of said regions extending through a gap in said insulating film to engage the surface of said substrate. Said regions of polycrystal silicon serve as a diffusion source for the formation of source and drain in the surface of said substrate, as well as providing at least a portion of the electrodes connected to said source and drain.

Said device is formed by depositing an insulating film on the surface of said substrate with a gap therein dimensioned to correspond to the source, drain and channel therebetween of the semiconductor device. A layer of polycrystal silicon is deposited on the surface of the substrate within said gap and on the region of the insulating film adjacent thereto. Said polycrystal silicon is then covered by a second insulating film and the portion of the second insulating film and polycrystal silicon defining the central region of the gap in said first-mentioned insulating film are removed and a gate insulating film is deposited therein. Further gaps are formed in said second insulating film in registration with each of the two portions of said polycrystal silicon and electro-conductive material is deposited in each of said gaps and in engagement with the gate insulating film to provide the electrode of the device. The source and drain are formed in the substrate by diffusion from said polycrystal silicon.

Accordingly, it is an object of this arrangement to provide a self-alignment type field-effect semiconductor device having substantially reduced superposition capacitance and junction capacitance, higher frequency response, low power dissipation and lower junction capacitance than the conventional insulated gate type field-effect semiconductor devices.

A further object of the invention is to provide a method for manufacturing such semiconductor devices.

Still other objects and advantages of the invention will in part be obvious and will in part be apparent from the specification and drawings.

The invention accordingly comprises the several steps and the relation of one or more of such steps with respect to each of the others, and the articles possessing the features, properties, and the relation of elements, which are exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

Figure 1:
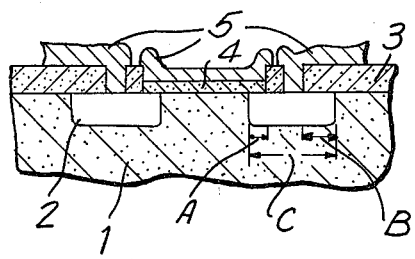
FIGS. 1 and 2 are cross sectional views of conventional field-effect semiconductor devices.

Referring now tto FIG. 1, the conventional insulated gate type field-effect transistor depicted includes a silicon (Si) substrate 1 having diffusion layers 2 formed therein representing the source and drain of the device. The surface of the substrate 1 is covered by a thick insulating film 3 except in a central region occupied by a gate insulating film 4 and two narrow regions in registration with each of the source and drain diffusion layers 2, an electro-conductive element 5 extending through each of said narrow regions to define the source and drain electrodes of the device. A further electro-conductive element is mounted in engagement with gate insulating film 4 to define the gate electrode of the device. One defect of the transistor of FIG. 1 is the limited frequency dependence which is in part caused by the superposed feedback capacitance of the device. Said capacitance is specifically caused by the superposition of the region A of each of the source and drain 2 and the gate electrode 5, region A of each of said source and drain being on the order of 5 microns in the conventional device, since the width of the gate electrode is predetermined by the limitations of the photo-etching technique utilized in the manufacture of the device. A further disadvantage in the conventional arrangements is caused by the need for the openings in the insulating film 3 through which the source and drain electrodes 5 extend. The minimum width of the contact area between the electrodes and the source and drain regions is 5 microns but each of the source and drain is enlarged as represented by the region B beyond what is required for such contact by a further 5 microns due to the limitations in the accuracy of the photo-etching process used to form such openings. This limitation in the accuracy of photoetching requires the provision of a source and drain region such that the conductive opening in insulating film 3 may be as large as 15 microns. This dimensional limitation makes it difficult to provide a large number of integrated insulated gate type field-effect transistors, 30 microns being required for the width of the source and drain alone.

Figure 2:
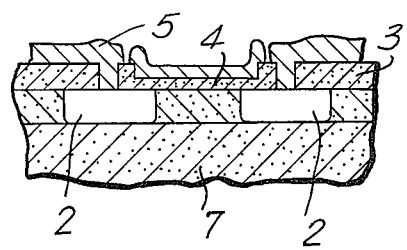

A further difficulty with the prior art arrangements results from the fact that while the depth of the source and drain is only about 2–3 microns, the width and length of said regions is more than 30 microns, so that the junction capacitance of region C of each of the source and drain is quite large, preventing high-speed operation and low power dissipation. In order to reduce this junction capacitance, the insulated gate field-effect transistor construction of FIG. 2 was developed. This structure, referred to as SIS, eliminates the junction capacitance of the lower part of the source and drain by the provision of an insulating material 7 as the lower part of the substrate. In all other respects, the structure is identical to the semiconductor device of FIG. 1. However, the device of FIG. 2 has not been widely used because it has proved difficult to grow a thin single crystal silicon substrate of 2–3 microns utilizing an insulating material as a substrate.

Figure 3A:
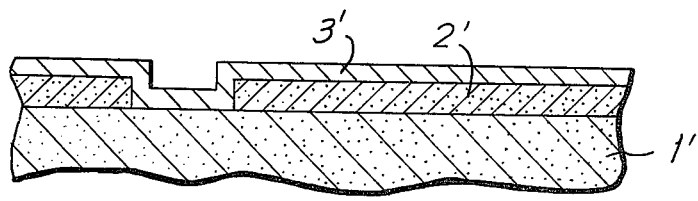
FIGS. 3a, 3b, 3c, 3d and 3e are cross sectional views of the semiconductor device in accordance with the invention in various stages of manufacture.
Figure 3B:
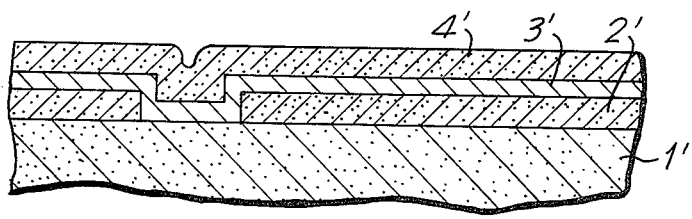
Figure 3C:
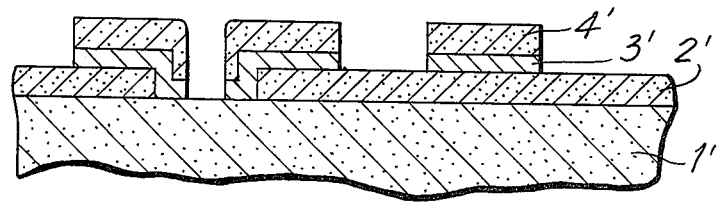
Figure 3D:
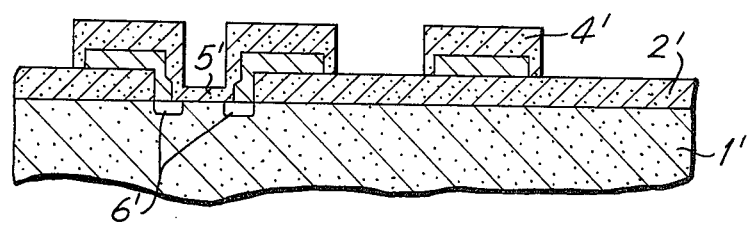
Figure 3E:
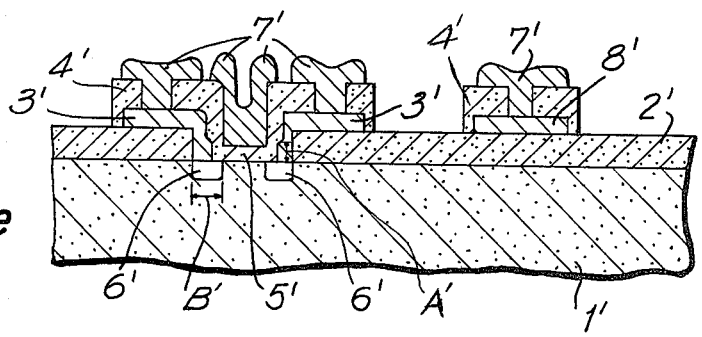

Referring now to FIG. 3e, a semiconductor device in accordance with the invention is depicted. This device is provided with a silicon substrate 1' having a first insulating film 2' deposited therein except in the region defining the source, drain and channel therebetween. Two layers of polycrystal silicon (Si) 3' having a type of conductivity opposite to that of substrate 1' are deposited on the surface of first insulating film 2' on opposed sides of the gap therein with portions of each of said polycrystal silicon layers engaging the surface of substrate 1' in the region adjacent the edge of said gap in said insulating film. The surface of said polycrystal silicon layers is covered by a second insulating film 4' except in the regions through which electro-conductive elements 7' extend to define the source and drain electrodes of the device. A gate insulating film 5' is formed on the surface of the substrate intermediate said polycrystal silicon layers, an electro-conductive element 7' engaging said gate insulating film 5' to define a gate electrode for the device.

A further layer of said polycrystal silicon material 8' is mounted on first insulating film 2' to provide a wiring connection. For this purpose, a second insulating film 4' surrounds layer 8' and an electro-conductive element 7' extends through a gap in said second insulating film 4' to engage polycrystal silicon layer 8'.

The method of manufacturing the semiconductor device of FIG. 3e is illustrated in FIGS. 3a – d. As shown in FIG. 3a, a first insulating film 2' is formed on silicon substrate 1' and the region of said first insulating film to be occupied by said source, drain and gate are removed by an etching technique. A layer or polycrystal silicon 3' doped with impurities which have a type of conductivity opposite to that of substrate 1' is then grown over the exposed surface of substrate 1' and first insulating film 2' as shown in FIG. 3a. A second insulating film 4' is formed on the surface of said polycrystal silicon as shown in FIG. 3b. The portions of insulating film 4' and polycrystal silicon 3' outside the regions required to define the source, gate and drain and related electrodes of the semiconductor device, and the wiring layer 8' are removed by etching as shown in FIG. 3c. Also as shown in FIG. 3c, the portion of said first insulating film and polycrystal silicon layer in the central region of the gap in first insulating film 2' is simultaneously removed by etching. Etching up to the thickness of the polycrystal silicon layer 3' is normally sufficient since impurities are seldom diffused into the silicon substrate 1' since the polycrystal silicon 3' is usually grown at a low temperature on the order of 500°–600°C. However, if the temperature at which the polycrystal silicon is grown is a little higher, the etching may extend slightly more deeply into the silicon substrate.

As shown in FIG. 3d, gate insulating film 5' is formed by thermal oxidation. Where high temperature CVD is used to form said gate insulating film, the diffusion layer 6' defining the source and drain is formed at the time of formation of gate insulating film 5'. Where said film is grown at a low temperature, for example by low-temperature CVD or anodic oxidation, heat treatment is necessary for the diffusion of the impurities from the polycrystal silicon into the silicon substrate to define diffusion layer 6'. Openings are formed in the surface of second insulating film 4' in registration with the source and drain polycrystal silicon layers 3' and the wiring polycrystal layer 8' by photo-etching, and electro-conductive elements 7' are deposited in engagement with each of said polycrystal silicon layers and gate insulating film layer 5' as shown in FIG. 3e.

One characteristic of the semiconductor device of FIG. 3e is the reduction of the superposition of the gate electrode in relation to the source and drain. If the second insulating film 4' is sufficiently thick, feedback capacitance caused by superposition in the region A' can be ignored. The thickness of the polycrystal silicon of the semiconductive device in accordance with the invention is less than 7,000 Angstrom while the region A of the source and drain of the conventional insulated gate type field-effect transistor overlapped by the gate electrode (see FIG. 1) is about 5 microns. For this reason, the superposition of the arrangement in accordance with the invention is less than 1/10 of the superposition of the conventional semiconductor device.

A shallow diffusion region formed by diffusion from the polycrystal silicon into the substrate is made possible since diffusion first occurs at the time of formation of the gate insulating film, so that there is only a small amount of diffusion in the transverse direction and a channel length of several microns is made possible. These characteristics also contribute to the high speed operating characteristics of the semiconductor device in accordance with the invention. The junction capacitance of the source and drain can be substantially reduced since the width B' of each of said source and drain can be less than 5 microns and would correspond to the width of the polycrystal silicon left after etching. If circumstances require, the dimension B' can be less than 2 microns. These values are remarkably small when compared with the width of the source and drain regions of conventional devices which are about 15 microns. These characteristics contribute to the high speed operation and low power dissipation of the insulated gate type field-effect transistor in accordance with the invention.

In the arrangement in accordance with the invention, polycrystal silicon doped with impurities is used not only as the diffusion source for the formation of the source and drain but also as an electro-conductive element in the circuit of the source and drain electrodes of the transistor and as an electro-conductive element 8' for wiring, thereby permitting many-layered wiring with a final electro-conductive element. Such final electro-conductive element may be formed of aluminum, gold, chromium, molybdenum and the like. The provision of such electro-conductive wiring elements, taken in conjunction with the reduced area of the source and drain makes it possible to integrate large numbers of the transistor in accordance with the invention. Moreover, if polycrystal silicon doped with impurities is used for wiring among the transistors of the integrated circuit, a few openings for the final wiring of the electrodes of each device is sufficient, and the reliability of the resulting circuit may be improved.

First insulating film 2' may be formed of $SiO_2$, $Si_3N_4$, $Al_2O_3$ and the like, either alone or in combination. Second insulating film 4' may be formed of $SiO_2$, $Si_3N_4$, $Al_2O_3$, P-doped $SiO_2$(PSG) and the like, either alone or in combination.

Figure 4A:
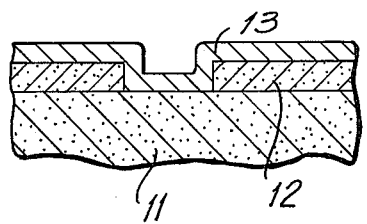
FIGS. 4a, 4b, 4c and 4d are cross sectional views of a semiconductor device in accordance with the invention demonstrating various stages of manufacture utilizing a second method in accordance with the invention.
Figure 4C:
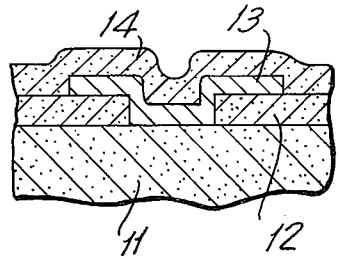
Figure 4B:
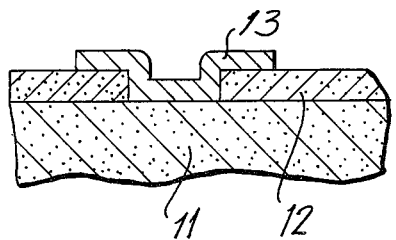
Figure 4D:
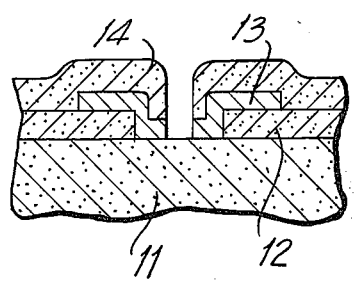

An alternate approach for the manufacture of the semiconductor device in accordance with the invention is illustrated in FIGS. 4a – d. As shown in FIG. 4a, a first insulating layer 12 is deposited on a substrate 11 and a region thereof is etched away to define the region in which the source, drain and gate are to be formed. A polycrystal silicon 13 is deposited on the exposed surfaces of substrate 11 and first insulating layer 12. As shown in FIG. 4b, the portions of the polycrystal silicon other than the portion within the gap in first insulating layer 12 and immediately on either side of said gap on the surface of said insulating film is etched away. A CVD second insulating film 14 is then deposited on the surface of the resulting product as shown in FIG. 4c. The central or gate region of second insulating film 14 and polycrystal silicon are then removed by etching. A gate insulating film is then formed on the surface of the substrate 11 thus exposed and the device is formed in accordance with the methods outlined in connection with FIGS. 3d and 3e.

The gate insulating film 5' may be formed not only of a thermal oxidation film, but also of a film formed from CVD $SiO_2$, $Si_3N_4$, $Al_2O_3$, PSG, anodic oxidation $SiO_2$ and the like, either alone or in combination. Such an insulating film may also be utilized as an insulating protective film over the entire surface of the device except the area of the bonding pad, after the formation of the electrode.

It will thus be seen that the objects set forth above, among those made apparent from the preceding description, are efficiently attained and, since certain changes may be made in carrying out the above method and in the composition set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A method of forming an insulated gate type field-effect semiconductor device comprising forming a first insulating film on the surface of a silicon substrate; removing a region of said first insulating film corresponding to the source, drain and gate regions of the semiconductor device to be formed; forming a layer of polycrystal silicon doped with impurities having a type of conductivity opposite to that of said substrate on the exposed surface of said substrate and said first insulating film; forming a second insulating film on the surface of said polycrystal silicon; removing portions of said second insulating film and said polycrystal silicon at least in the region surrounding the region thereof adjacent the source, drain and gate regions of said substrate and in registration with the desired gate region of said substrate; forming a gate insulating film on the exposed surface of said substrate defining said gate region; forming said source and drain regions using said polycrystal silicon layer as a diffusion source; forming apertures in said second insulating film providing access to the two portions of said polycrystal silicon layer associated respectively with said source and drain; and forming electro-conductive elements, one of said elements extending through each of said apertures in said second insulating film for respectively engaging each of said polycrystal silicon layer portions and a further of said elements engaging said gate insulating film.

2. The method of claim 1, including removing all of said polycrystal silicon layer and second insulating film except in said source, drain and gate region and in a region spaced from said source, drain and gate region; forming an aperture in the portion of said second insulating film in said region spaced from said source, drain and gate region and forming an electro-conductive element extending through said last-mentioned aperture for engagement with the associated portion of said polycrystal silicon layer.

3. The method as recited in claim 1, wherein said source and drain regions are formed by diffusion from said polycrystal silicon portions during the formation of said gate insulating film.

4. The method as recited in claim 3, wherein said gate insulating film is formed by thermal oxidation.

5. The method as recited in claim 3, wherein said gate insulating film is formed by high temperature CVD.

6. The method as recited in claim 1, wherein said semiconductor device is subjected to heat treatment for diffusion from said polycrystal silicon layer portion to form said source and drain.

7. The method as recited in claim 1, wherein said gate insulating film is formed of a material selected from the group consisting of thermal oxidation film, CVD $SiO_2$, $Si_3N_4$, $Al_2O_3$, P-doped $SiO_2$, anodic oxidation $SiO_2$, and a combination of at least two of CVD $SiO_2$, $Si_3N_4$, $Al_2O_3$, P-doped $SiO_2$, and anodic oxidation $SiO_2$.

8. The method as recited in claim 1, wherein said first insulating film is formed from a material selected from the group consisting of $SiO_2$, $Si_3N_4$, $Al_2O_3$ and a combination of at least two of $SiO_2$, $Si_3N_4$ and $Al_2O_3$.

9. The method as recited in claim 1, wherein said second insulating film is formed of a material selected from the group consisting of $SiO_2$, $Si_3N_4$, $Al_2O_3$, P-doped $SiO_2$ and a combination of at least two of $SiO_2$, $Si_3N_4$, $Al_2O_3$ and P-doped $SiO_2$.

10. A method for forming an insulated gate type field-effect semiconductor device consisting of forming a layer of a first insulated film on a silicon substrate; removing a region of said substrate corresponding to the source, drain and gate region of the semiconductor device to be formed; depositing a layer of polycrystal silicon doped with impurities which have a type of conductivity opposite to that of said substrate on the exposed surface of said substrate and first insulating layers; removing at least the region of said polycrystal silicon surrounding the region immediately adjacent said source, drain and gate region; forming a second insulating film layer on the exposed surface of said first insulating film and said polycrystal silicon; removing the central portion of said second insulating film and polycrystal silicon in registration with said gate region; forming a gate insulating film on the thus-exposed surface of said substrate; forming a source and a drain by diffusion from said polycrystal silicon portions; forming apertures in said second insulating film to expose a portion of the surface of each of said polycrystal silicon portions; and forming electro-conductive elements, one of said elements extending through each of said apertures for respective engagement with each of said polycrystal silicon elements, one of said elements engaging said gate insulating film.

11. The method as recited in claim 10, wherein all of said polycrystal silicon is removed except in the vicinity of said source, drain and gate region and in a region spaced from said source, drain and gate region, a further aperture being formed in said second insulating film in registration with the portion of said polycrystal silicon layer at said spaced region and a further electro-conductive element being formed to extend through said further aperture for engagement with said spaced polycrystal silicon element.

12. The method as recited in claim 10, wherein said source and drain regions are formed by diffusion from said polycrystal silicon portions during the formation of said gate insulating film.

13. The method as recited in claim 10, wherein said gate insulating film is formed by thermal oxidation.

14. The method as recited in claim 10, wherein said gate insulating film is formed by high temperature CVD.

15. The method as recited in claim 10, wherein said semiconductor device is subjected to heat treatment for diffusion from said polycrystal silicon layer portion to form said source and drain.

16. The method as recited in claim 10, wherein said gate insulating film is formed of a material selected from the group consisting of thermal oxidation film, CVD $SiO_2$, $Si_3N_4$, $Al_2O_3$, P-doped $SiO_2$, anodic oxidation $SiO_2$, and combinations of at least two of CVD $SiO_2$, $Si_3N_4$, $Al_2O_3$, P-doped $SiO_2$, and anodic oxidation $SiO_2$.

17. The method as recited in claim 10, wherein said first insulating film is formed from a material selected from the group consisting of $SiO_2$, $Si_3N_4$, $Al_2O_3$ and a combination of at least two of $SiO_2$, $Si_3N_4$ and $Al_2O_3$.

18. The method as recited in claim 10, wherein said second insulating film is formed of a material selected from the group consisting of $SiO_2$, $Si_3N_4$, $Al_2O_3$, P-doped $SiO_2$ and a combination of at least two of $SiO_2$, $Si_3N_4$, $Al_2O_3$ and P-doped $SiO_2$.

\* \* \* \* \*